US008455179B2

(12) United States Patent
Yamamoto

(10) Patent No.: US 8,455,179 B2
(45) Date of Patent: *Jun. 4, 2013

(54) METHOD OF FORMING SEMICONDUCTOR DEVICE BY USING REDUCTION PROJECTION ALIGNER

(75) Inventor: Takanori Yamamoto, Kumamoto (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/473,262

(22) Filed: May 16, 2012

(65) Prior Publication Data

US 2012/0225387 A1 Sep. 6, 2012

Related U.S. Application Data

(63) Continuation of application No. 12/453,997, filed on May 28, 2009, now Pat. No. 8,202,685.

(30) Foreign Application Priority Data

Jun. 2, 2008 (JP) ................................. 2008-144675

(51) Int. Cl.
*G03F 7/26* (2006.01)
*G03F 7/20* (2006.01)

(52) U.S. Cl.
USPC ............................ 430/312; 430/311; 430/394

(58) Field of Classification Search
USPC .................. 430/311, 328, 397, 322
See application file for complete search history.

(56) References Cited

U.S. PATENT DOCUMENTS

| 5,329,157 | A | 7/1994 | Rosotker |
| 5,340,772 | A | 8/1994 | Rosotker |
| 5,341,024 | A | 8/1994 | Rosotker |
| 5,874,189 | A | 2/1999 | Stroh et al. |
| 5,960,305 | A | 9/1999 | Kumar |
| 7,488,668 | B2 | 2/2009 | Arita et al. |
| 8,202,685 | B2 * | 6/2012 | Yamamoto .................... 430/394 |
| 2006/0019416 | A1 | 1/2006 | Arita et al. |
| 2007/0002293 | A1 | 1/2007 | Park et al. |

FOREIGN PATENT DOCUMENTS

| JP | 61-242021 A | 10/1986 |
| JP | 6-97279 A | 4/1994 |
| JP | 9-027445 A | 1/1997 |

(Continued)

OTHER PUBLICATIONS

Japanese Office Action dated Jun. 26, 2012 (with English Translation).

*Primary Examiner* — Cynthia Kelly
*Assistant Examiner* — Caleen Sullivan
(74) *Attorney, Agent, or Firm* — McGinn IP Law Group, PLLC

(57) ABSTRACT

A method of forming a semiconductor device, including exposing a first shot to light on a semiconductor wafer, the first shot including a plurality of elongated chip patterns, the plurality of elongated chip patterns being arranged in parallel to each other and exposing a second shot to light on the semiconductor wafer, the second shot including a plurality of elongated chip patterns, so that the plurality of elongated chip patterns of the second shot and the plurality of elongated chip patterns of the first shot are arranged perpendicular to each other. The plurality of elongated chip patterns of the second shot are generated by rotating the plurality of elongated chip patterns of the first shot by 90 degrees.

7 Claims, 3 Drawing Sheets

FOREIGN PATENT DOCUMENTS

| | | |
|---|---|---|
| JP | 9-190971 A | 7/1997 |
| JP | 9-311432 A | 12/1997 |
| JP | 2001-230181 A | 8/2001 |
| JP | 2006-041005 A | 2/2006 |

* cited by examiner

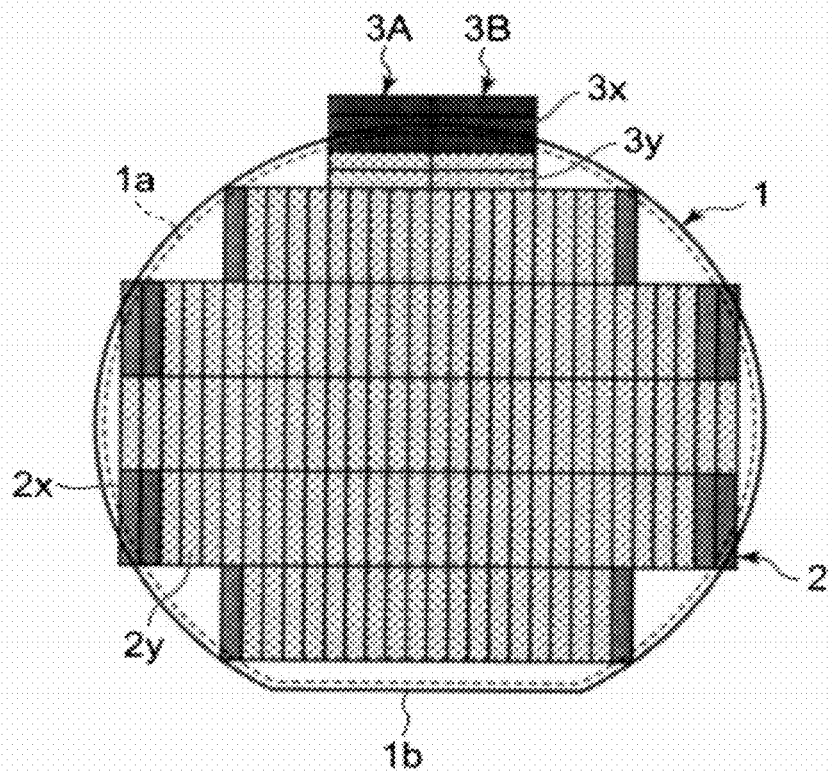

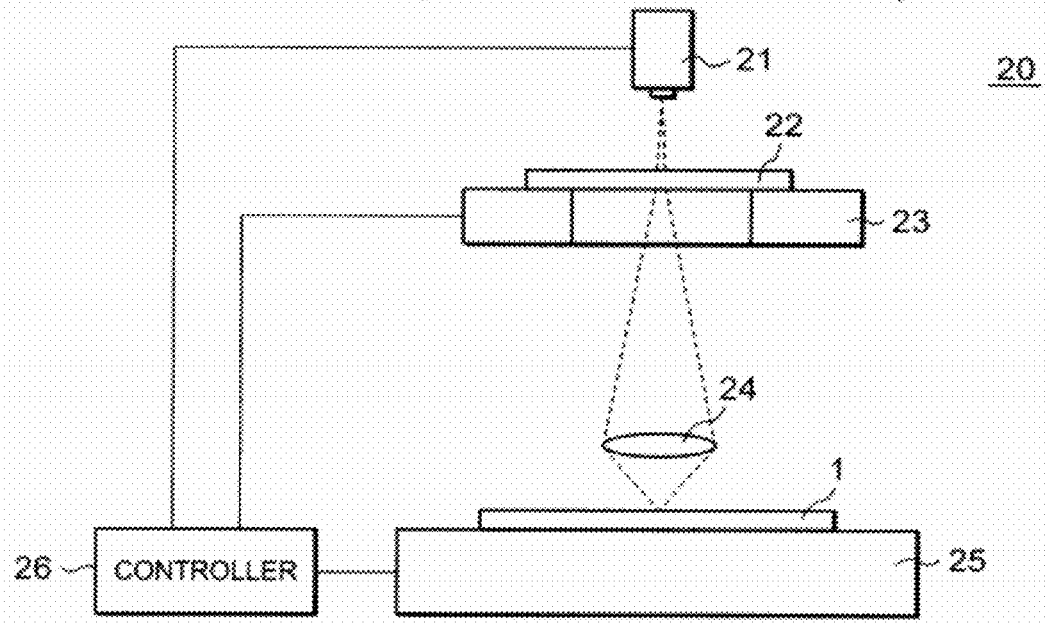
FIG. 2 (FIRST EMBODIMENT)
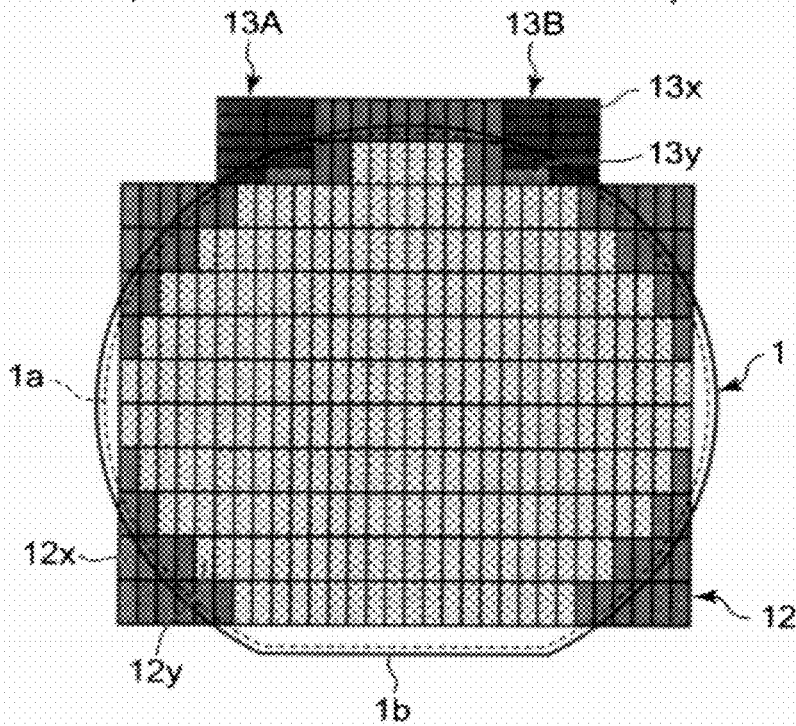
FIG. 3
(SECOND EMBODIMENT)

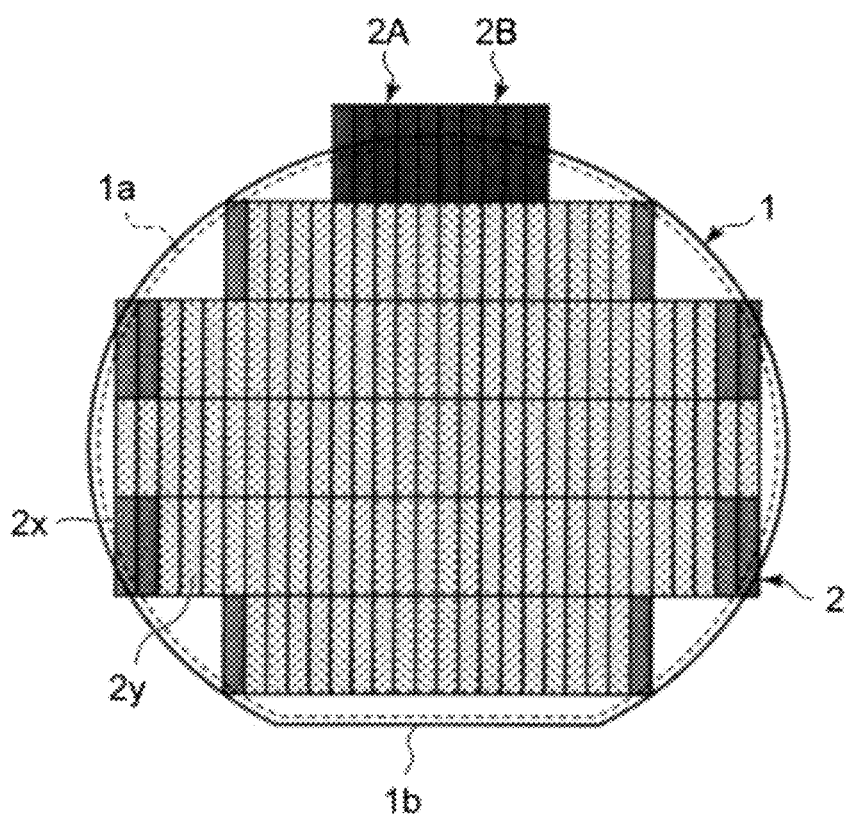

METHOD OF FORMING SEMICONDUCTOR DEVICE BY USING REDUCTION PROJECTION ALIGNER

The present application is a Continuation Application of U.S. patent application Ser. No. 12/453,997 filed on May 28, 2009 now U.S. Pat. No. 8,202,685, and claims priority from Japanese Patent Application No. 2008-144675, filed on Jun. 2, 2008, the entire contents of which is incorporated herein by reference.

BACKGROUND OF THE INVENTION

1. Field of the Invention

The present invention relates to a semiconductor device manufacturing method and more particularly to a semiconductor device manufacturing method with respect to the light exposure of chip patterns on each semiconductor wafer in a lithography process.

2. Description of Related Art

In the lithography process among the manufacturing processes of semiconductor devices (chips), a reduction projection aligner (stepper) is often used to carry out light exposure for chip patterns formed on a reticle (mask) repetitively onto the photoresist on the subject semiconductor wafer. The reticle has a plurality of rectangular chip patterns formed to cut the wafer into a plurality of chips and the photoresist is patterned into one shot of chips. Those chip patterns are disposed so that the maximum number of semiconductor devices can be obtained from each semiconductor wafer by taking consideration to the reduction of the chip manufacturing cost. There are some techniques having been proposed for such disposition of chip patterns, which are disclosed in the following patent documents.

For example, the patent document 1 discloses a method that determines how to dispose chip patterns entirely in an element forming effective region. According to the method, in the unit element formation effective region, a plurality of parallel lines are disposed at intervals of the second line length of the region, thereby forming a plurality of parallel line segment regions and each of those segment regions is disposed independently from other parallel line segment regions so that the maximum number of unit element forming regions can be obtained in each of the parallel line segment regions. The disposition of such a unit element forming region in each parallel line segment region is determined as that in the whole element formation effective region.

On the other hand, the patent document 2 discloses a method that forms die regions on each object semiconductor wafer. According to the method, at first, a first set of parallel scribe lines is formed. Those scribe lines are separated actually from each other at equal intervals and extended in the direction of the chord by crossing the semiconductor wafer. Then, a second set of parallel scribe lines is formed so as to be separated from each other and extended in the direction of the chord by crossing the semiconductor wafer. A third set of parallel scribe lines are formed so as to be separated actually from each other at equal intervals and extended in the direction of the chord by crossing the semiconductor wafer. The third set of scribe lines crosses the first set of scribe lines at a second minus angle "θ" that is different from the first angle at each point where the first and second sets of scribe lines cross each other. This method defines a plurality of die regions enclosed by those first to third sets of scribe lines on the object semiconductor wafer.

Furthermore, the third patent document discloses a shot map creating method that defines disposition of a plurality of shot regions for forming chip patterns on a substrate by drawing a mask pattern formed on a reticle. According to the method, a plurality of chip patterns for cutting out a plurality of chips are formed in the plurality of shot regions respectively, then the plurality of shot regions are disposed so that the maximum number of chips can be positioned in the effective light exposure region on the substrate, that is, in the effective substrate region.

[Patent document 1] Japanese Patent Application Laid Open No. 2006-41005
[Patent document 2] Japanese Patent Application Laid Open No. Hei 6 (1994)-97279
[Patent document 3] Japanese Patent Application Laid Open No. 2001-230181

SUMMARY

The methods disclosed in the patent documents 1 to 3 have no problems if the sizes of the subject semiconductor chips are comparatively small. If the sizes of the chips are very large in the X or Y direction (large aspect ratio), however, then the semiconductor wafer comes to have a large region at its periphery and no chips can be formed there. This has been a problem. Particularly, liquid crystal drivers to be employed in LCDs (Liquid Crystal Display) have been shaped to have larger sizes in the longitudinal direction (shaped in rectangle with a large aspect ratio) for the reasons of the limitation required when they are mounted on panels, the expanding sizes of the liquid crystal panels, etc. This problem has been more remarkable in recent years.

In a first exemplary aspect of the present invention, the semiconductor device manufacturing method, when carrying out light exposure for chip patterns on each semiconductor wafer in a lithography process, includes carrying out light exposure for chip patterns in a first shot region in one direction on the semiconductor wafer and carrying out light exposure for chip patterns in a second shot region obtained by rotating the first shot region by 90° with respect to a region in which all the chip patterns in the first shot region at the periphery on the semiconductor wafer are not regarded as effective.

According to the exemplary aspect of the present invention, because the manufacturing method can carry out light exposure (patterning) for effective chip patterns at the periphery of the subject semiconductor wafer where any of the methods of the related art cannot form chip patterns, the method can increase the number of chips to be obtained from each semiconductor wafer (the effective number of chips or yield), thereby reducing the manufacturing cost.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 1 is an explanatory view of a shot map in an example for describing the semiconductor device manufacturing method in the first exemplary embodiment of the present invention;

FIG. 2 is an explanatory view of a stepper employed in the semiconductor device manufacturing method in the first exemplary embodiment of the present invention;

FIG. 3 is an explanatory view of a shot map in an example for describing the semiconductor device manufacturing method in the second exemplary embodiment of the present invention; and FIG. 4 is an explanatory view of a shot map in a related example for describing the semiconductor device manufacturing method.

DETAILED DESCRIPTION OF THE EXEMPLARY EMBODIMENTS

The semiconductor device manufacturing method according to an exemplary embodiment of the present invention includes a lithography step of carrying out light exposure for chip patterns (denoted with 2y and 2x in FIG. 1) on a subject semiconductor wafer (denoted with 1 in FIG. 1). Concretely, the lithography process includes carrying out light exposure for chip patterns (2y and 2x in FIG. 1) in a first shot region (denoted with 2 in FIG. 1) in one direction on the semiconductor wafer (1 in FIG. 1) and carrying out light exposure for chip patterns (3x and 3y in FIG. 1) in a second shot region (3A and 3B in FIG. 1) obtained by rotating the first shot region (denoted with "2" in FIG. 1) by 90° with respect to a periphery region in which all the chip patterns in the first shot region (2 in FIG. 1) on the semiconductor wafer (1 in FIG. 1) are not regarded as effective.

[First Exemplary Embodiment]

FIG. 1 is an explanatory view of a shot map for describing the semiconductor device manufacturing method in a first exemplary embodiment of the present invention. FIG. 2 is an explanatory view of a stepper in a configuration employed for the semiconductor device manufacturing method in the first exemplary embodiment of the present invention. FIG. 4 is an explanatory view of a shot map for describing a semiconductor device manufacturing method of a related art.

The semiconductor device manufacturing method in the first exemplary embodiment is to be employed in a stage for carrying out light exposure for a photoresist (not shown) on a semiconductor wafer with respect to the chip patterns 2y and 3y in a lithography process (see FIG. 1). Here, a stepper 20 as shown in FIG. 2 is used for the light exposure.

The stepper 20 is used to carry out light exposure for the chip patterns (2x, 2y, 3x, and 3y in FIG. 1) that are reduced in size and projected in the shot regions, respectively on the entire surface of the semiconductor wafer 1 by moving the wafer 1. The stepper 20 includes a light irradiator 21, a reticle 22, a reticle stage 23, a lens 24, a wafer stage 25, and a controller 26.

The light irradiator 21 exposes the reticle 22 to light and the controller 26 controls the light irradiation. The reticle 22 is a mask (not shown) having expanded chip patterns (2x, 2y, 3x, and 3y in FIG. 1) in the shot regions (2, 3A, and 3B in FIG. 1), respectively. The reticle stage 23 mounts the reticle 22. The controller 26 controls positioning of the reticle 22 (e.g., by rotating). The lens 24 forms shot regions on the semiconductor wafer by condensing the light beam passing through the reticle 22. The wafer 25 mounts the semiconductor wafer 1. The controller 26 controls positioning of the semiconductor wafer 1 properly (e.g., by rotating). The controller 26 controls the irradiation of the light irradiator 21 and controls the reticle stage 23 and the wafer stage 25 so as to position the reticle 22 and the semiconductor wafer 1, respectively.

The semiconductor wafer 1 is shaped approximately as a circular one. The wafer 1 has an orientation flat 1b formed flatly at part of its end portion (see FIG. 1). The orientation flat 1b is used for the positional adjustment between each of the shot regions 2, 3A, and 3B and the reticle (22 in FIG. 2) mask pattern. The semiconductor wafer 1 includes an effective wafer region 1a in which semiconductor devices (chips) can be formed. The region 1a excludes a peripheral region of the semiconductor wafer 1, in which semiconductor devices (chips) might be damaged. In the lithography process, a photoresist (not shown) is formed on the semiconductor chip 1 before light exposure is carried out by the stepper (20 in FIG. 2). After the light exposure, the semiconductor wafer 1 is subjected to the treatments in steps of developing, etching, and photoresist removing. The photoresist on the semiconductor wafer 1 is exposed to light as follows.

At first, the chip patterns 2x and 2y in the first shot region 2 are exposed to light on the semiconductor wafer 1 (step A1). Here, the reticle (22 in FIG. 1) is held as is in the first direction while the semiconductor wafer 1 is moved (in the X and Y axis directions) to expose the chip patterns 2x and 2y that are reduced in size and projected on the photoresist (not shown) repetitively on the semiconductor wafer 1. The contents of the step IA are the same as those of the conventional example (see FIG. 4).

Here, the first shot region 2 means a shot region exposed to light in accordance with the shape of the reticle (22 in FIG. 2) in the first direction. In the first shot region are disposed five chip patterns (2x and 2y) having the same pattern. The chip patterns (2x and 2y) are formed in a rectangular region (of which aspect ratio (long side/short side) is at least 2 or more) having a very large size in the X-axis direction (horizontal direction in FIG. 1) and in the Y-axis direction (vertical direction in FIG. 1) like a liquid crystal driver. Of the chip patterns (2x and 2y), the effective chip patterns 2y are disposed in the effective wafer region of the semiconductor wafer 1 and the not-effective chip patterns 2x are put in contact with the boundary phase line of the effective wafer region 1a. If all the chip patterns in the first shot region 2 are regarded as not-effective chip patterns 2x upon light exposure (e.g., the first shot regions 2A and 2B in FIG. 4), the region is not exposed to light.

Thereafter, the first shot region 2 is rotated by 90° with respect to a region in which all the chip patterns in the first shot region at the periphery of the semiconductor wafer 1 are regarded as not-effective ones to carry out light exposure for the chip patterns 3x and 3y in the second shot regions 3A and 3B on the semiconductor wafer 1 (step A2). Here, while the reticle (22 in FIG. 1) is held as is in the first direction, the semiconductor wafer 1 is rotated by 90°, then the semiconductor wafer 1 is moved (in the X-axis and Y-axis directions) to carry out light exposure for the photoresist (not shown) regions of the chip patterns 3x and 3y that are reduced in size and projected in each of the second shot regions 3A and 3B on the semiconductor wafer 1, which are not exposed to light in step A1.

Here, the second shot regions 3A and 3B are obtained by rotating the first shot region 2 by 90°. Upon the light exposure in step A1, all the chip patterns in the first shot region 2 are regarded as not-effective ones 2x. Upon the light exposure in step A2, however, only some of the chip patterns in the second shot regions 3A and 3B are regarded as not-effective ones 3y. In the second shot regions 3A and 3B, just like in the first shot region 2, there are five chips (3x and 3y) having the same pattern. The chip patterns (3x and 3y) are formed in a very large rectangular region (of which aspect ratio (long side/short side) is at least 2 or more) in the X-axis direction (horizontal direction in FIG. 1) and in the Y-axis direction (vertical direction in FIG. 1) just like a liquid crystal driver. Of the chip patterns (3x and 3y), effective chip patterns 3y are disposed in the effective wafer region 1a of the semiconductor wafer 1 and not-effective chip patterns 3x come in contact with the boundary phase line with the effective wafer region 1a. Upon the light exposure, if all the chip patterns in the second shot regions 3A and 3B are regarded as not-effective chip patterns 2x, then the region is not exposed to light.

According to the first exemplary embodiment, even in case of rectangular semiconductor devices (chips) such as liquid crystal drivers having large aspect ratios respectively, the number of effective chip patterns 2y and 3y to be obtained from each semiconductor wafer increases (two in the example of FIG. 1), thereby the number of semiconductor devices (chips) to be obtained from one semiconductor wafer also comes to increase.

In the first exemplary embodiment, while the reticle 22 is held as is in the first direction, light exposure is carried out in the first direction, then the semiconductor wafer 1 is rotated by 90° on the wafer stage to carry out light exposure in the second direction so as to realize the above-described light exposure method that rotates the object shot region by 90°. However, it is also possible to carry out light exposure in the second direction by rotating the reticle 22 by 90° after carrying out light exposure for the reticle 22 in the first direction without rotating the semiconductor wafer 1 by 90°.

[Second Exemplary Embodiment]

FIG. 3 is an explanatory view of a shot map in an example for describing the semiconductor device manufacturing method in a second exemplary embodiment of the present invention.

In case of the semiconductor device manufacturing method in the second exemplary embodiment, the chip patterns are smaller in size than those in the first exemplary embodiment 1 (see FIG. 1). In the second exemplary embodiment, the light exposure is carried out in the same way as that in the steps A1 and A2 in the first exemplary embodiment. However, light exposure is not carried out for the chip patterns (3x and 3y in FIG. 1) in the second shot regions (3A and 3B in FIG. 1) in which effective chip patterns (3y in FIG. 1) can be formed only in a region enclosed by an arc at the opposite side of the orientation flat (1b in FIG. 1) and by one side (at the end portion of the first shot region group) just like in the first exemplary embodiment, but light exposure is also carried out for the chip patterns 13x and 13y in the second shot regions 13A and 13B in which effective chip patterns 13y can be formed even in a region enclosed by an arc and two sides (that makes a right angle at the end portion of the group 12 of the first shot regions).

According to the second exemplary embodiment, therefore, because effective chip patterns 13y can be formed not only in a region enclosed by an arc at the opposite side of the orientation flat 1b and by one side although it depends on the chip size, but also even in a region enclosed by an arc and by two sides, thereby the number of semiconductor devices (chips) to be obtained from one semiconductor wafer can be increased.

Further, it is noted that Applicant's intent is to encompass equivalents of all claim elements, even if amended later during prosecution.

What is claimed:

1. A method of forming a semiconductor device, the method comprising:
    exposing a first shot to light on a semiconductor wafer, said first shot including a plurality of elongated chip patterns, the plurality of elongated chip patterns being arranged in parallel to each other; and
    exposing a second shot to light on the semiconductor wafer, the second shot including a plurality of elongated chip patterns, no that the plurality of elongated chip patterns of the second shot and the plurality of elongated chip patterns of the first shot are arranged perpendicular to each other,
    wherein the plurality of elongated chip patterns of the second shot are generated by rotating the plurality of elongated chip patterns of the first shot by 90 degrees.

2. The method as claimed in claim 1, wherein the first shot and the second shot are squarely shaped so that the first shot and the second shot are arranged with substantially no space therebetween.

3. The method as claimed in claim 2, wherein a portion of the elongated chip patterns of the second shot is exposed on the semiconductor wafer, the portion being adjacently placed with the first shot, so that the elongated chip pattern relating to the portion is fully placed on the semiconductor wafer.

4. The method as claimed in claim 3, wherein the first shot is provided in a majority portion including a center portion of the semiconductor wafer, and the second shot is provided in a peripheral portion of the semiconductor wafer where the elongated semiconductor chip of the first shot is beyond the semiconductor wafer.

5. The method as claimed in claim 4, wherein the plurality of elongated chips of the first shot and the plurality of elongated chips of the second shot are arranged in at least two columns and at least two rows comprising both of the first shot and the second shot, the first shot being provided in the peripheral portion so that a portion of the plurality of elongated chips of the first shot is exposed on the semiconductor wafer and a remaining portion of the plurality of elongated chips of the first shot is not exposed on the semiconductor wafer.

6. The method as claimed in claim 1, wherein the first shot comprises a plurality of first shots.

7. The method as claimed in claim 6, wherein the second shot comprises a plurality of second shots.

* * * * *